United States Patent
Chen et al.

(10) Patent No.: US 7,269,013 B2
(45) Date of Patent: Sep. 11, 2007

(54) HEAT DISSIPATION DEVICE HAVING PHASE-CHANGEABLE MEDIUM THEREIN

(75) Inventors: Chun-Chi Chen, Shenzhen (CN); Shi-Wen Zhou, Guangdong (CN); Zhan Wu, Guangdong (CN)

(73) Assignees: Fu Zhun Prexision Industry (Shan Zhen) Co., Ltd., Shenzhan, Guangdong; Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/306,700

(22) Filed: Jan. 9, 2006

(65) Prior Publication Data

US 2007/0159798 A1    Jul. 12, 2007

(51) Int. Cl.
*H05K 7/20* (2006.01)

(52) U.S. Cl. ............. 361/700; 361/695; 361/703; 361/704; 361/709; 361/710; 257/706; 257/707; 257/715; 257/722; 174/15.2; 174/15.3; 165/80.3; 165/104.19; 165/104.21; 165/104.26; 165/104.33

(58) Field of Classification Search ............... 361/695, 361/700, 703, 704, 709, 710; 257/706, 707, 257/715, 722; 174/15.2, 16.3; 165/80.3, 165/104.19, 104.21, 104.26, 104.33
See application file for complete search history.

(56) References Cited

U.S. PATENT DOCUMENTS

| | | | | |
|---|---|---|---|---|
| 4,633,371 | A * | 12/1986 | Nagy et al. | 361/699 |
| 6,386,274 | B1 * | 5/2002 | Wang et al. | 165/80.3 |
| 6,714,415 | B1 | 3/2004 | Shah | |
| 6,913,072 | B2 * | 7/2005 | Luo | 165/104.21 |
| 6,937,473 | B2 * | 8/2005 | Cheng et al. | 361/704 |
| 7,120,019 | B2 * | 10/2006 | Foster et al. | 361/695 |
| 7,142,422 | B2 * | 11/2006 | Lee et al. | 361/695 |
| 2002/0060902 | A1 * | 5/2002 | Lee | 361/704 |
| 2004/0108104 | A1 * | 6/2004 | Luo | 165/181 |

* cited by examiner

*Primary Examiner*—Boris Chérvinsky
*Assistant Examiner*—Courtney Smith
(74) *Attorney, Agent, or Firm*—Winston Hsu

(57) ABSTRACT

A heat dissipation device includes a heat dissipation body and a heat conducting body thermally combined with the heat dissipation device. The heat dissipation body includes a central portion defining a through hole therein and a plurality of fin extending from a periphery of the central portion. Each of the fins branches a plurality of portions at an end thereof. The heat conducting body includes a column thermally fitted in the through hole of the central portion of the heat dissipation body. A cavity is defined between the column and the central portion of the heat dissipation body. The cavity contains a phase-changeable medium therein, which becomes vapor once the column absorbs heat from a heat-generating electronic device.

20 Claims, 4 Drawing Sheets

HEAT DISSIPATION DEVICE HAVING PHASE-CHANGEABLE MEDIUM THEREIN

FIELD OF THE INVENTION

The present invention relates generally to a heat dissipation device, and more particularly to a heat dissipation device used for dissipating heat generated by an electronic device.

DESCRIPTION OF RELATED ART

With advancement of computer technology, electronic devices operate rapidly. It is well known that more rapidly the electronic devices operate, more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Conventionally, the heat dissipation device has a heat sink. The heat sink comprises a heat conducting column and a cylindrical heat dissipation body. The cylindrical heat dissipation body comprises a cylindrical core and a plurality of fins extending radially outwards from the core. The core defines a vertical through hole therethrough for receiving the column therein. The column is interferentially fitted in the through hole of the core. Therefore, an outer face of the column contacts with an inner face of the core. In use, a bottom of the column contacts to a heat generating electronic device and absorbs heat from the electronic device. The heat in the column is transferred to an upper portion of the column along an axial direction and to the core and the fins along a radial direction of the column. Then, the heat in the fins is dissipated to an ambient air. However, the column and the core have a certain degree of roughness at the outer face of column and the inner face of the core; thus, the two faces can not have an intimate contact with each other, and air gaps exist between the two faces. Therefore, a high thermal resistance exists between the column and the core of the heat dissipation body, which results in a low heat transferring efficiency between the two faces. Consequently, the heat generated by the electronic device cannot timely reach the fins to be dissipated. And thus, the heat is accumulated in the column. The normal function of the electronic device is impacted adversely.

What is needed, therefore, is a heat dissipation device having a great heat transferring capacity and improved heat dissipating capacity.

SUMMARY OF INVENTION

A heat dissipation device in accordance with a preferred embodiment of the present invention comprises a heat dissipation body, a heat conducting body thermally combined with the heat dissipation device, and a locking device engaging with the heat conducting body. The heat dissipation body comprises a central portion defining a through hole therein and a plurality of fin extending from a periphery of the central portion. Each of the fins branches a plurality of portions at an end thereof. The heat conducting body comprises a column thermally fitted in the through hole of the central portion of the heat dissipation body. A cavity is defined between the column and the central portion of the heat dissipation body. The cavity contains a phase-changeable medium therein, such as water or alcohol. The medium becomes vapor when the column absorbs heat from a heat generating electronic device.

Other advantages and novel features will become more apparent from the following detailed description of preferred embodiments when taken in conjunction with the accompanying drawings, in which:

DETAILED DESCRIPTION

Figure 1:
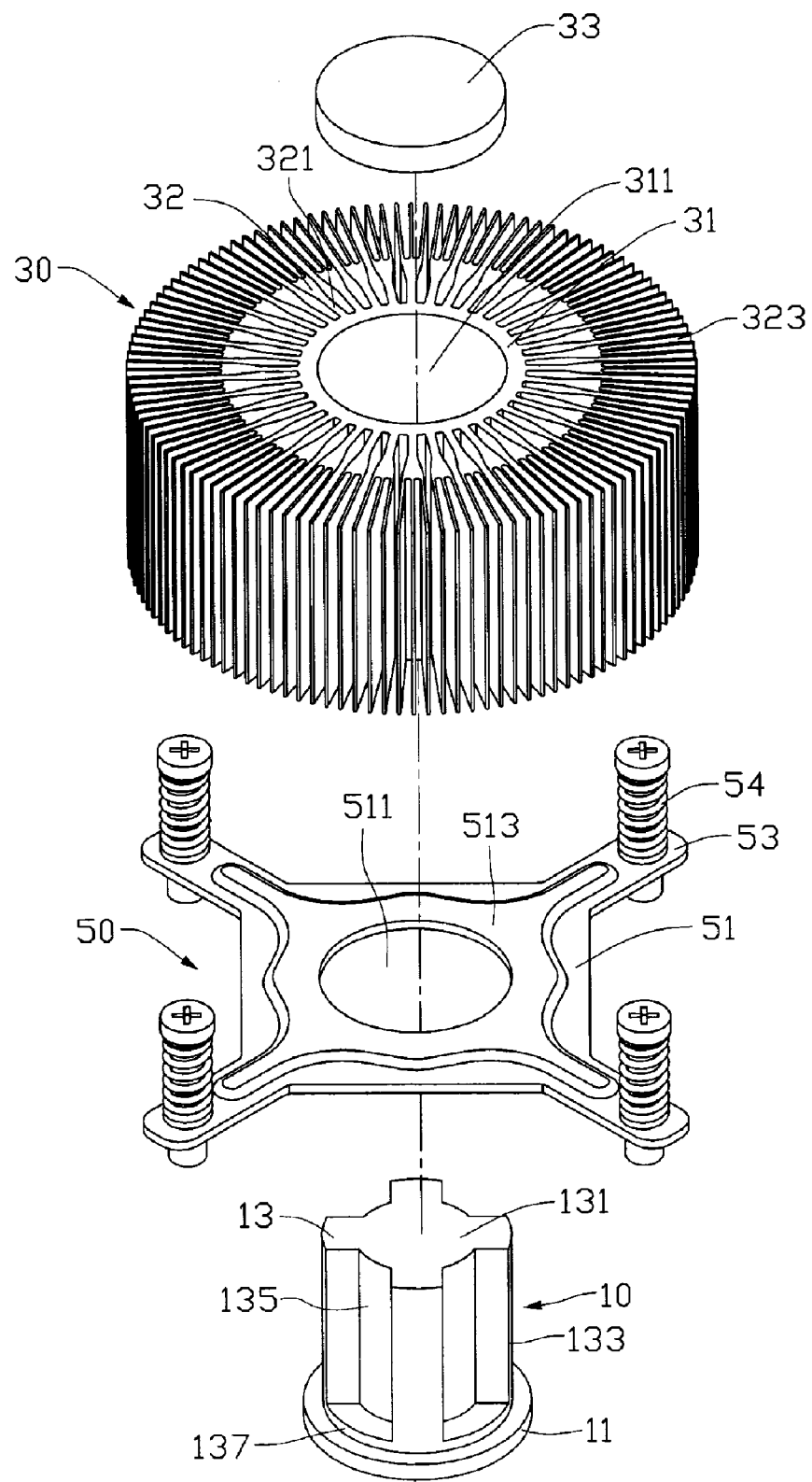
FIG. 1 is an exploded, isometric view of a heat dissipation device in accordance with a preferred embodiment of the present invention.

Referring to FIG. 1, a heat dissipation device in accordance with a preferred embodiment of the present invention comprises a heat sink and a locking device 50 for securing the heat sink to a heat generating electronic device (not shown) located on a printed circuit board (not shown). The heat sink comprises a heat conducting body 10 and a heat dissipation body 30 thermally engaged with the conducting body 10.

The heat conducting body 10, which is made of metal having a good heat conductivity such as copper, comprises a circular heat receiver 11 and a column 13 extending upwardly from the heat receiver 11. The column 13 comprises a solid core 131 in a center thereof. Four uniformly distributing spokes 133 extend radially from a periphery of the core 131. Four notches 135 are defined between the spokes 133 and the core 131. The column 13 has a round bottom portion 137 below the notches 135 and above the heat receiver 11.

The heat dissipation body 30 comprises a cylindrical central portion 31 and a plurality of radial fins 32 extending outwardly from the central portion 31. The central portion 31 defines a circular through hole 311 vertically throughout a center of the central portion 31, for receiving the column 13 of the heat conducting body 10 therein. The fins 32 have a height, which is the same as that of the central portion 31. Each of the fins 32 has a main portion 321 connecting with the central portion 31 and three offsetting portions 323 integrally branching outwardly from a free end of the main portion 321.

Figure 2:
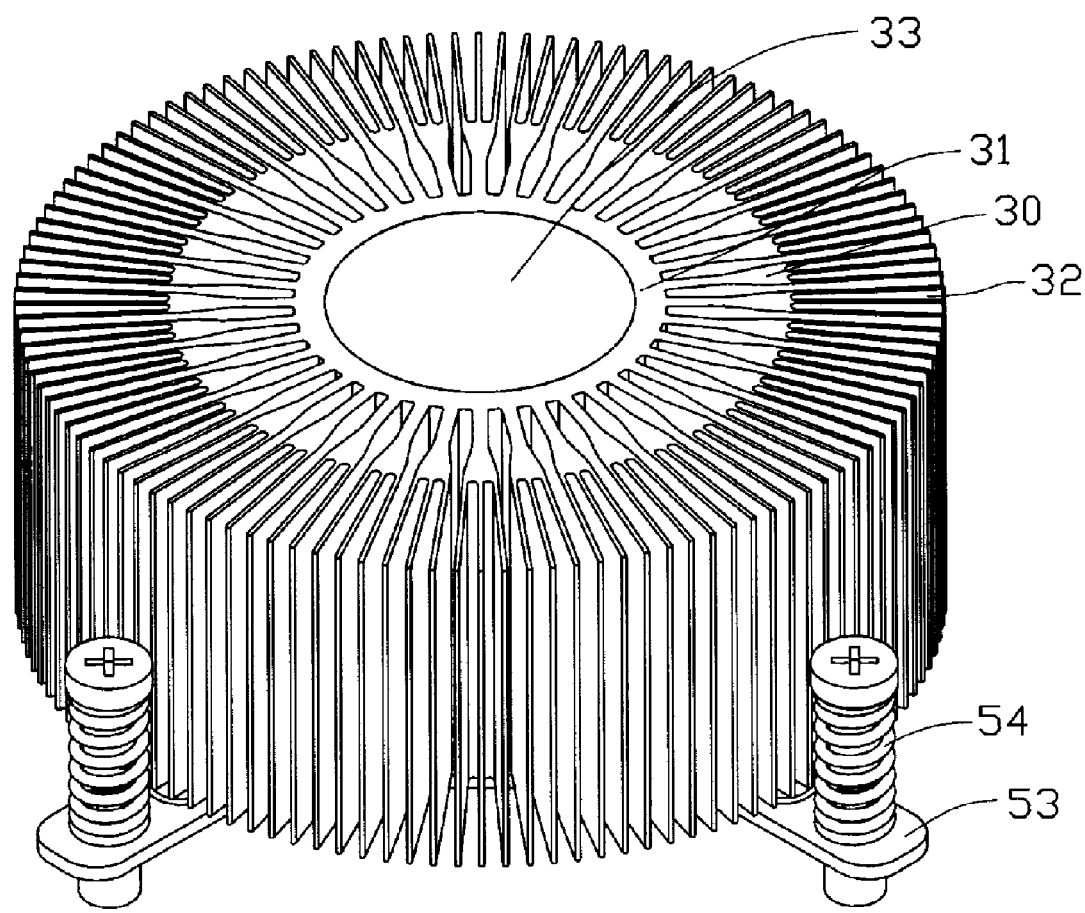
FIG. 2 is an assembled view of FIG. 1.
Figure 3:
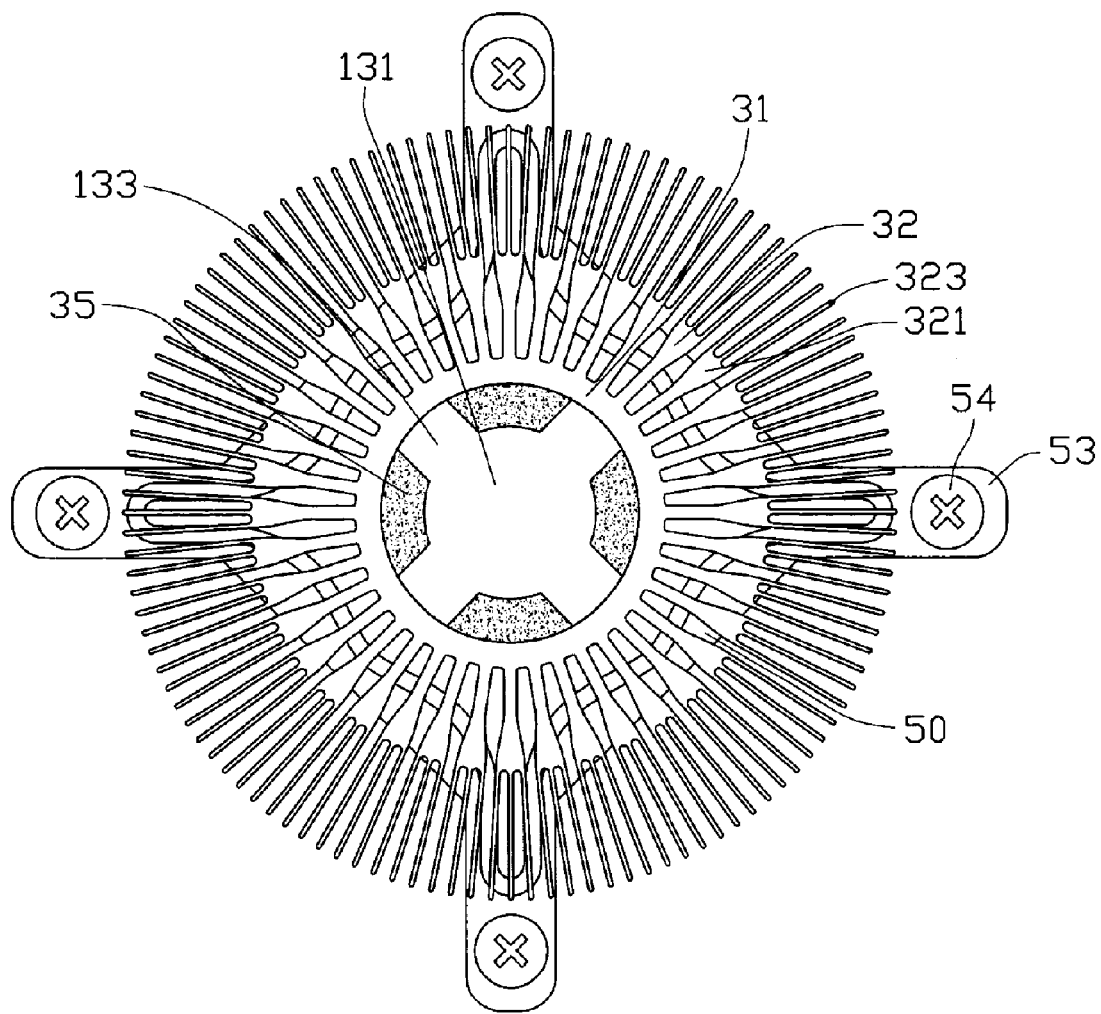
FIG. 3 is a top view of FIG. 2, with a lid of the heat dissipation device being removed.
Figure 4:
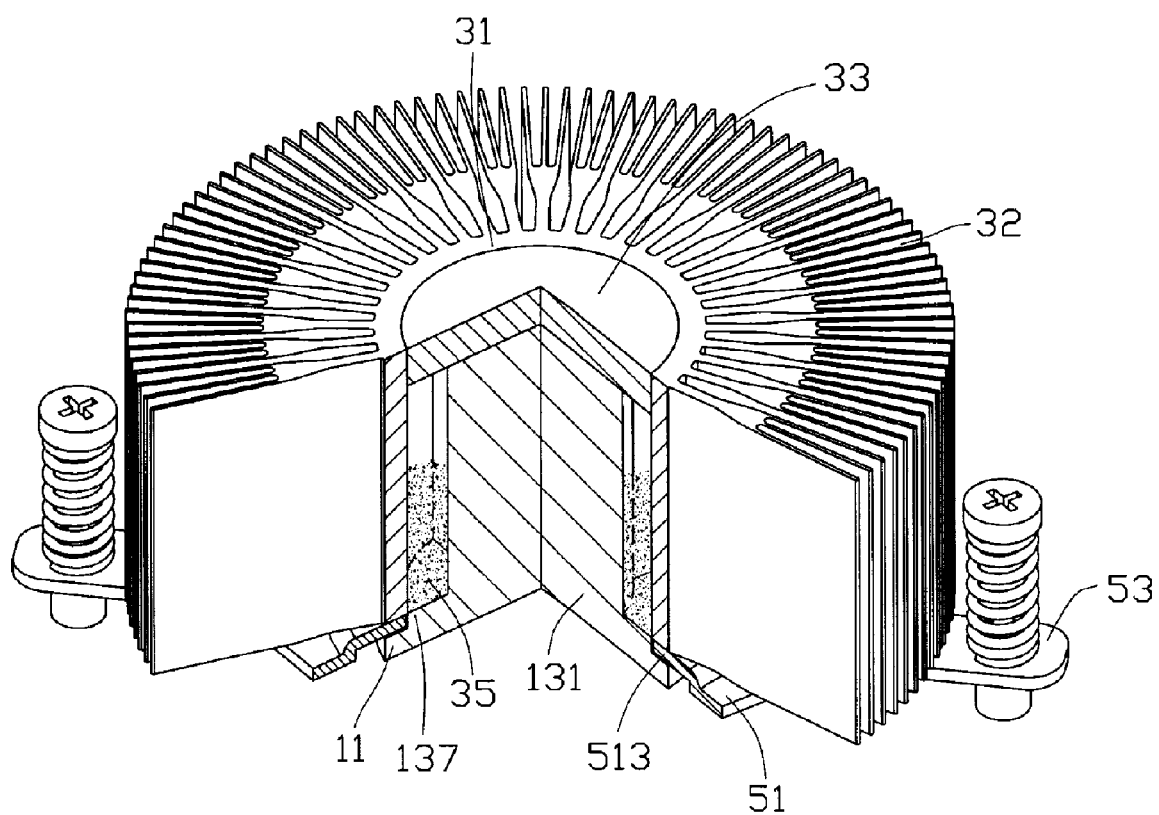
FIG. 4 is a view similar FIG. 2, with a part thereof being cut away.

Referring to FIGS. 2-4, in assembly of the heat conducting body 10 and the heat dissipation body 30 of the heat sink, the column 13 is fitted in the through hole 311 of the central portion 31 of the heat dissipation body 30. The column 13 can be securely fitted in the through hole 311 via an interferential engagement between the column 13 and the central portion 31, which is achieved by firstly heating the heat dissipation body 30 to expand the through hole 311. The column 13 is then inserted into the through hole 311 under the expanded condition. When the heat dissipation body 30 is cooled, the central portion 31 shrinks to have an interferential engagement with the column 13 so that the heat conducting body 10 and the heat dissipation body 30 are securely connected together. The bottom portion 137 of the column 13 of the heat conducting body 10 is located outside the through hole 311 of the central portion 31 of the heat dissipation body 30 and seals a bottom end of the through hole 311. A slot (not labeled and best seen in FIG. 4) is defined between the heat receiver 11 of the heat conducting body 10 and the central portion 31 of the heat dissipation body 30 when the two bodies 10, 30 are connected together. The slot is used for accommodating the locking device 50 to thereby mount the locking device 50 to the two bodies 10, 30. Particularly see FIG. 3, the spokes 133 intimately contact with an inner face of the central portion 31. Each notch 135 is surrounded by the inner face of the central portion 31, two adjacent spokes 133, a periphery face of the core 131 and the bottom portion 137 of the column 13; therefore, four cavities 35 are defined between the column 13 of the heat conducting body 10 and the central portion 31 of the heat dissipation body 30. Each cavity 35 is filled with a phase-changeable medium which has a phase change when it is heated above or cooled below to certain temperatures, respectively. The medium can be water or alcohol, which becomes vapor when it receives heat from the heat conducting body 10 when the heat receiver 11 thermally contacts with the heat generating electronic device. Particularly see FIG. 4, a lid 33 is inserted into the through hole 311 of the central portion 31 to seal the cavities 35 of the heat sink from a top of the cavities 35.

Referring back to FIG. 1, the locking device 50 comprises a substantially rectangular plate 51 and four fixing legs 53 extending outwardly from four corners of the plate 51, respectively. The plate 51 has an opening 511 defined in a center thereof. A diameter of the opening 511 is larger than that of the column 13, but smaller than that of the heat receiver 11 of the heat conducting body 10. An engaging portion 513 of the plate 51 around the opening 511 is embossed upwardly. The engaging portion 513 further extends to the fixing legs 53. Each of the legs 53 has a fixing hole (not labeled) defined in a distal end thereof for fittingly receiving a fastener 54 therein. The fasteners 54 are used to attach the heat dissipation device to the printed circuit board (not shown). The fasteners 54 each comprise a screw (not labeled) and a spring (not labeled) combined to the screw.

Referring also to FIG. 4, the bottom portion 137 of the column 13 of the heat conducting body 10 is received in the opening 511 of the plate of 51 the locking device 50. Thereof, the engaging portion 513 of the plate 51 is sandwiched between the heat dissipation body 30 and the heat receiver 11 of the heat conducting body 10. The engaging portion 513 engages with the bottom portion 137. The distal ends of the four fixing legs 53 of the locking device 50 extend away from the fins 32 of the heat dissipation body 30.

In use, the heat sink is intimately attached to the heat generating electronic device (not shown) located on the printed circuit board via the locking device 50 fixed to the printed circuit board. The heat receiver 11 contacts with the electronic device and absorbs heat from the electronic device. The heat reaches the bottom portion 137, the core 131 and the spokes 133 of the column 13; the phase-changeable medium in the cavities 35 is heated up and has phase change to become vapor. Therefore, the heat is transferred to the central portion 31 and fins 32 via the phase-changeable medium and the spokes 133 to be dissipated to an ambient air.

Furthermore, a fan (not shown) can be provided to be positioned atop of the heat sink to provide a forced airflow to the heat sink.

According to the preferred embodiment of the present invention, the phase-changeable medium is filled in the cavities 35 between the column 13 of the heat conducting body 10 and the central portion 31 of the heat dissipation body 30. When the heat conducting body 10 absorbs heat from the electronic device, the phase-changeable medium is heated up and has a phase change to transfer the heat from the heat conducting body 10 to the central portion 31 and the fins 32 of the heat dissipation body 30. In comparison with the conventional heat dissipation device, the heat in the conducting body 10 can be rapidly transferred to the fins 32 via the phase-changeable medium.

Moreover, the fins 32 of the heat dissipation device 30 branch a plurality of offsetting portions 323, which increase heat dissipation area of the heat dissipation device 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
   a heat dissipation body comprising a central portion defining a through hole therein and a plurality of fins extending from a periphery of the central portion, each of the fins branching into a plurality of portions at an end thereof; and
   a heat conducting body comprising a column thermally fitted in the through hole of the central portion of the heat dissipation body, a plurality of separate cavities being defined between the column and the central portion of the heat dissipation body, the separate cavities containing a phase-changeable medium therein.

2. The heat sink of claim 1, wherein the plurality of fins integrally extend from the central portion of the heat dissipation body.

3. The heat sink of claim 2, wherein the central portion of the heat dissipation body is cylindrical, and wherein the fins radially extend from the periphery of the central portion.

4. The heat sink of claim 3, wherein the through hole extends throughout a center of the central portion along an axial direction of the central portion.

5. The heat sink of claim 1, wherein the column of the heat conducting body has a solid central core and a plurality of spokes radially extending from the core, the spokes extending from an end to an opposite end of the through hole of the central portion of the heat conducting body along an axial direction of the central portion, the spokes thermally contacting with an inner face of the central portion of the heat dissipation body.

6. The heat sink of claim 5, wherein the column of the heat conducting body has a round end engaged in the through hole of the central portion of the heat dissipation body.

7. The heat sink of claim 6 further comprising a lid, wherein each of the cavities is hermetically defined between the lid, the inner face of the central portion of the heat dissipation body, a periphery of the core, two adjacent spokes and the round end of the column of the heat conducting body.

8. The heat sink of claim 6, wherein the heat conducting body has a heat receiver extending from the round end of the column thereof along an axial of the column and extending beyond the through hole of central portion of the heat dissipation body.

9. The heat sink of claim 7, wherein the heat receiver of the heat conducting body has a flat face for contacting with a heat generating device.

10. The heat sink of claim 1, wherein each of the fins comprises a main portion and three offsetting portions branching from the main portion.

11. A heat dissipation device comprising:
- a heat dissipation body comprising a central portion defining a through hole therein and a plurality of fins radially extending from a periphery of the central portion;
- a heat conducting body comprising a column being thermally fitted in the through hole of the central portion of the heat dissipation body, a plurality of separate cavities being defined between the column and the central portion of the heat dissipation body, the separate cavities containing phase-changeable medium therein; and
- a locking device located between the heat dissipation body and the heat conducting body and engaging with the heat conducting body.

12. The heat dissipation device of claim 11, wherein the column has a central solid core and a plurality of spokes radially extending from the core and fitted in the through hole of the central portion of the heat dissipation body.

13. The heat dissipation device of claim 12 further comprising a lid, wherein each of the cavities is hermetically defined between the lid, an inner face of the central portion of the heat dissipation body, two adjacent spokes and a round end of the column of the heat conducting body.

14. The heat dissipation device of claim 13, wherein the locking device comprises an engaging portion and an opening surrounded by the engaging portion, and wherein the heat conducting body has an heat receiver extending from the round end of the column, and wherein the engaging portion of the locking device is sandwiched between the heat receiver of the heat conducting body and the heat dissipation body via the round end of the column being fitted in the opening of the locking device.

15. The heat dissipation device of claim 14, wherein the locking device comprises a plurality of fixing legs extending from the engaging portion.

16. The heat dissipation device of claim 11, wherein each of the fins branches a plurality of offsetting portions.

17. A heat dissipation device comprising:
- a heat conducting body having a central core and a plurality of spokes extending radially outwardly from the central core;
- a heat dissipating body having a cylindrical central portion and a plurality of fins extending outwardly from the cylindrical central portion, wherein the cylindrical central portion accommodating the heat conducting body therein, the spokes engaging with an inner face of the cylindrical central portion thereby to define a plurality of separate cavities between the heat conducting body and the heat dissipation body; and
- a phase-changeable medium being filled in the separate cavities, wherein the phase-changeable medium becomes vapor upon receiving heat from a heat-generating electronic device in thermal contact with a bottom face of the heat conducting body.

18. The heat dissipation device of claim 17 further comprising a locking device sandwiched between the heat conducting body and a bottom of the heat dissipation body, adapted for fastening the heat dissipation device to a printed circuit board on which the heat-generating electronic device is mounted.

19. The heat dissipation device of claim 18 further comprising a lid fittingly inserted into the cylindrical central portion of the heat dissipation body and covering a top of the heat conducting body.

20. The heat dissipation device of claim 18, wherein the locking device has four fasteners at four corners of the locking device, respectively, adapted for engaging with the printed circuit board, each fastener having a screw and a spring combined to the screw.

* * * * *